US012757451B2

(12) United States Patent
Xie et al.

(10) Patent No.: US 12,757,451 B2
(45) Date of Patent: Oct. 6, 2026

(54) SEMICONDUCTOR DEVICE WITH BOTTOM DIELECTRIC ISOLATION

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 977 days.

(21) Appl. No.: 17/520,690

(22) Filed: Nov. 7, 2021

(65) Prior Publication Data

US 2023/0143041 A1 May 11, 2023

(51) Int. Cl.

| | |
|---|---|
| ***H10D 30/62*** | (2025.01) |
| ***B82Y 10/00*** | (2011.01) |
| ***H10D 30/01*** | (2025.01) |
| ***H10D 62/10*** | (2025.01) |
| *H10D 30/67* | (2025.01) |

(52) U.S. Cl.

CPC ......... *H10D 62/115* (2025.01); *H10D 30/024* (2025.01); *H10D 30/62* (2025.01); *H10D 30/6219* (2025.01); *H10D 62/119* (2025.01); *H10D 30/6735* (2025.01)

(58) Field of Classification Search

CPC .. H10D 30/024; H10D 30/62; H10D 30/6219; H10D 30/6735; H10D 30/6757; H10D 30/014; H10D 30/43; H10D 62/115; H10D 62/119; H10D 62/121; H10D 84/038; H10D 84/83; H10D 64/017; B82Y 10/00

See application file for complete search history.

(56) References Cited

U.S. PATENT DOCUMENTS

| | | | | |
|---|---|---|---|---|
| 7,307,273 | B2 | 12/2007 | Currie | |
| 7,335,545 | B2 | 2/2008 | Currie | |
| 9,627,263 | B1 | 4/2017 | He et al. | |
| 10,014,390 | B1 * | 7/2018 | Bouche | B82Y 10/00 |
| 10,217,846 | B1 * | 2/2019 | Xie | H10D 30/025 |
| 10,361,315 | B1 * | 7/2019 | Yeh | H10D 30/025 |
| 10,468,409 | B2 | 11/2019 | Lee | |
| 10,629,497 | B2 | 4/2020 | Chung | |
| 10,832,983 | B2 | 11/2020 | Choi | |
| 2015/0021690 | A1 | 1/2015 | Jacob | |
| 2015/0056781 | A1 | 2/2015 | Akarvardar | |
| 2015/0162436 | A1 | 6/2015 | Toh | |
| 2015/0221726 | A1 | 8/2015 | Wong | |
| 2016/0197004 | A1 | 7/2016 | Akarvardar | |
| 2017/0053825 | A1 | 2/2017 | Seo | |

(Continued)

FOREIGN PATENT DOCUMENTS

| | | | |
|---|---|---|---|
| CN | 104584223 | B | 6/2018 |
| EP | 23244961 | A | 5/2011 |

*Primary Examiner* — Omar F Mojaddedi

(74) *Attorney, Agent, or Firm* — David K. Mattheis

(57) ABSTRACT

A semiconductor device includes a substrate, a first shallow trench isolation (STI) liner disposed above and in contact with the substrate, a bottom dielectric isolation (BDI) region disposed above the substate and in contact with the STI liner, a device channel disposed above the BDI region, and a gate stack disposed above and in contact with the device channel.

7 Claims, 29 Drawing Sheets

200

(56) References Cited

U.S. PATENT DOCUMENTS

| | | | | |
|---|---|---|---|---|
| 2019/0287971 | A1* | 9/2019 | Lee | H10D 84/834 |
| 2019/0341448 | A1* | 11/2019 | Bourjot | H10D 30/6212 |
| 2020/0152734 | A1* | 5/2020 | Frougier | H10D 62/115 |
| 2020/0176304 | A1 | 6/2020 | Adusumilli | |
| 2021/0184016 | A1 | 6/2021 | Cheng | |
| 2021/0202325 | A1 | 7/2021 | Lee | |

* cited by examiner

1200

300

2900

SEMICONDUCTOR DEVICE WITH BOTTOM DIELECTRIC ISOLATION

BACKGROUND

The disclosure relates generally to field effect transistor (FET) devices. The disclosure relates particularly to FET devices having bottom dielectric isolation (BDI) elements.

FET devices may include BDI elements to reduce leakage currents under FET channels between source/drain regions. BDI regions may be formed beneath device channels by selective removal of a high germanium concentration sacrificial layer and deposition of a low-k spacer material in place of the sacrificial layer.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect a semiconductor device includes a substrate, a first shallow trench isolation (STI) liner disposed above and in contact with the substrate, a bottom dielectric isolation (BDI) region disposed above the substate and in contact with the STI liner, a device channel disposed above the BDI region, and a gate stack disposed above and in contact with the device channel.

In one aspect, a method of forming a semiconductor device includes forming a sacrificial layer upon a substrate, forming a semiconductor channel upon the sacrificial layer, forming a first shallow trench isolation (STI) liner adjacent to the substrate and the sacrificial layer, exposing a portion of the sacrificial layer, removing at least a portion of the sacrificial layer, and forming a second STI liner in conjunction with a bottom dielectric isolation layer.

In one aspect, a method of forming a semiconductor device includes forming a sacrificial layer upon a substrate, forming a semiconductor channel upon the sacrificial layer, removing a portion of the sacrificial layer, forming inner spacers between the substrate and the semiconductor channel, forming a channel separation trench, removing remaining sacrificial layer, forming a bottom dielectric isolation (BDI) and shallow trench isolation (STI) liner, and forming a channel fin above the BDI.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
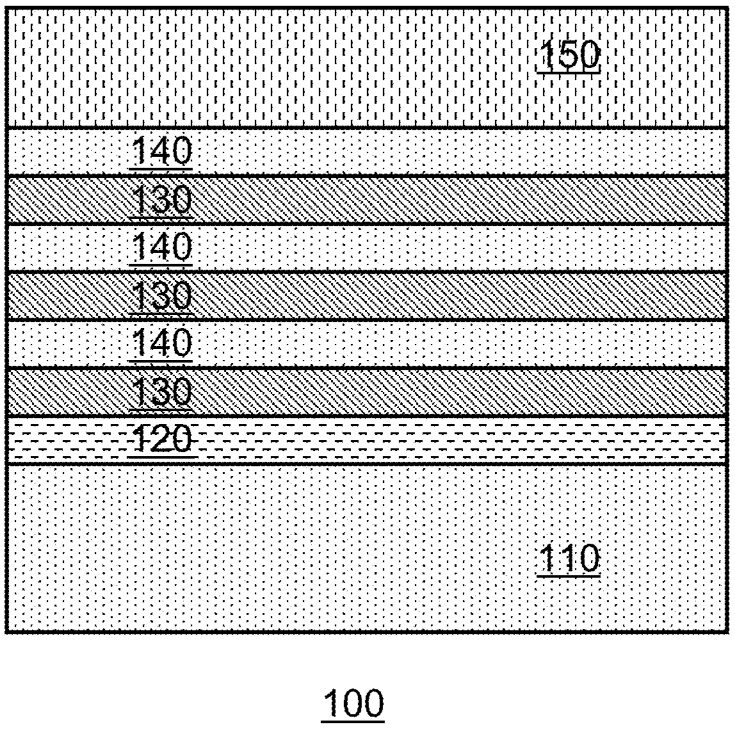
FIG. 1 provides a cross-sectional view of a step in the fabrication of a semiconductor device, according to an embodiment of the invention. The figure illustrates a formed stack of alternating nanosheets (NS), upon a substrate and sacrificial semiconductor layer.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

As semiconductor device downscaling proceeds beyond the 5 nanometer threshold, nanosheet (NS) channel transistor architecture appears to be an enabling design option. NS transistors benefit from a bottom dielectric isolation layer to suppress leakage current between the source and drain regions of the transistors and passing under the nanosheet channels. Typical BDI formation includes removal of a high Ge concentration sacrificial layer and deposition of a low-k dielectric spacer material in its place. This process may yield adverse device artifacts including oxidation of the high Ge layer during formation of shallow trench isolation regions, subsequently resulting in BDI air gaps and the accompanying structural weaknesses. The processes may additionally lead to undercutting the gate structures leading to a collapse of these structures on the STI regions. The processes also risk mechanical instability of the gate structures after removal of the high Ge concentration sacrificial layer and prior to the deposition of the BDI material. Disclosed embodiments include structures and formation methods for forming BDI regions at an early fabrication stage (before dummy gate formation). Embodiments include structures wherein the BDI and an STI liner are continuous, as well as structures where the BDI comprises multiple dielectric portions, first portions formed under fin or nanosheet channel edges, to support the fin or nanosheet stack during formation of additional BDI portions under the central portion of the fin or stack. Such methods provide increased mechanical stability for the channel structures during formation of the BDI.

Reference is now made to the figures. The figures provide schematic cross-sectional illustration of semiconductor devices at intermediate stages of fabrication, according to one or more embodiments of the invention. The device provide schematic representations of the devices of the invention and are not to be considered accurate or limiting with regards to device element scale.

FIG. 1 provides a schematic view of a device 100 according to an embodiment of the invention following the deposition of a stack of nanosheet layers for the formation of FET device nanosheets. In an embodiment, the stack includes alternating layers of epitaxially grown silicon germanium 120, 130, and silicon 140. Other materials having similar properties may be used in place of the SiGe and Si.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The nanosheet stack includes a bottom-most layer of a first semiconductor material, such as SiGe and alternating layers of a second semiconductor material, such as Si. The nanosheet stack is depicted with seven layers (three SiGe layers 130, and three Si layers 140, forming a device, and a high Ge concertation, e.g., 40%-70% Ge, SiGe layer 120, separating the device stack from the underlying semiconductor substrate 110. However, any number and combination of layers can be used so long as the layers alternate between SiGe and Si to form a device and include a high Ge concentration SiGe layer separating the device from the substrate. The nanosheet stack is depicted with the layers being in the form of nanosheets, however the width of any given nanosheet layer can be varied so as to result in the form of a nanowire, a nanowire, etc. SiGe layers 130, can be composed of, for instance, $SiGe_{15-35}$, examples thereof including, but not limited to $SiGe_{15}$, $SiGe_{20}$, $SiGe_{25}$ . . . $SiGe_{35}$.

Substrate 110 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In an embodiment, each sacrificial semiconductor material layer 130 and 120, is composed of a first semiconductor material which differs in composition from at least an upper portion of the semiconductor substrate 110. In one embodiment, the upper portion of the semiconductor substrate 110 is composed of silicon, while each sacrificial semiconductor material layers 130 and 120 is composed of a silicon germanium alloy. In such an embodiment, the SiGe alloy that provides each sacrificial semiconductor material layer 120 has a germanium content that is greater than 45 atomic percent germanium. In one example, the SiGe alloy that provides each sacrificial semiconductor material layer 120 has a germanium content from 45 atomic percent germanium to 70 atomic percent germanium. In such an embodiment, the SiGe alloy that provides each sacrificial semiconductor material layer 130 has a germanium content that is less than 45 atomic percent germanium. In one example, the SiGe alloy that provides each sacrificial semiconductor material layer 130 has a germanium content from 15 atomic percent germanium to 35 atomic percent germanium. The first semiconductor material that provides each sacrificial semiconductor material layers 130 and 120 can be formed utilizing an epitaxial growth (or deposition process).

Each semiconductor channel material layer 140, is composed of a second semiconductor material that has a different etch rate than the first semiconductor material of the sacrificial semiconductor material layers 130 and 120. The second semiconductor material of each semiconductor channel material layer 140, may be the same as, or different from, the semiconductor material of at least the upper portion of the semiconductor substrate 110. The second semiconductor material can be a SiGe alloy provided that the SiGe alloy has a germanium content that is less than 45 atomic percent germanium, and that the first semiconductor material is different from the second semiconductor material.

In one example, at least the upper portion of the semiconductor substrate 110 and each semiconductor channel material layer 140 is composed of Si or a III-V compound semiconductor, while each sacrificial semiconductor material layer 130, 120 is composed of a silicon germanium alloy. The second semiconductor material of each semiconductor channel material layer 140, can be formed utilizing an epitaxial growth (or deposition process).

FIG. 1 also illustrate a hard mask 150 disposed above the nanosheet stack. Hard mask 150 includes a nitride, oxide, an oxide-nitride bilayer, or another suitable material. In some embodiments, the hard mask 150 may include an oxide such as silicon oxide (SiO), a nitride such as silicon nitride (SiN), an oxynitride such as silicon oxynitride (SiON), combinations thereof, etc. In some embodiments, the hard mask 150 is a silicon nitride such as $Si_3N_4$.

The figures illustrate an embodiment comprising nanosheet channels. The invention should not be considered limited to nanosheet structures but also encompasses structures comprising fin FET devices.

Figure 2:
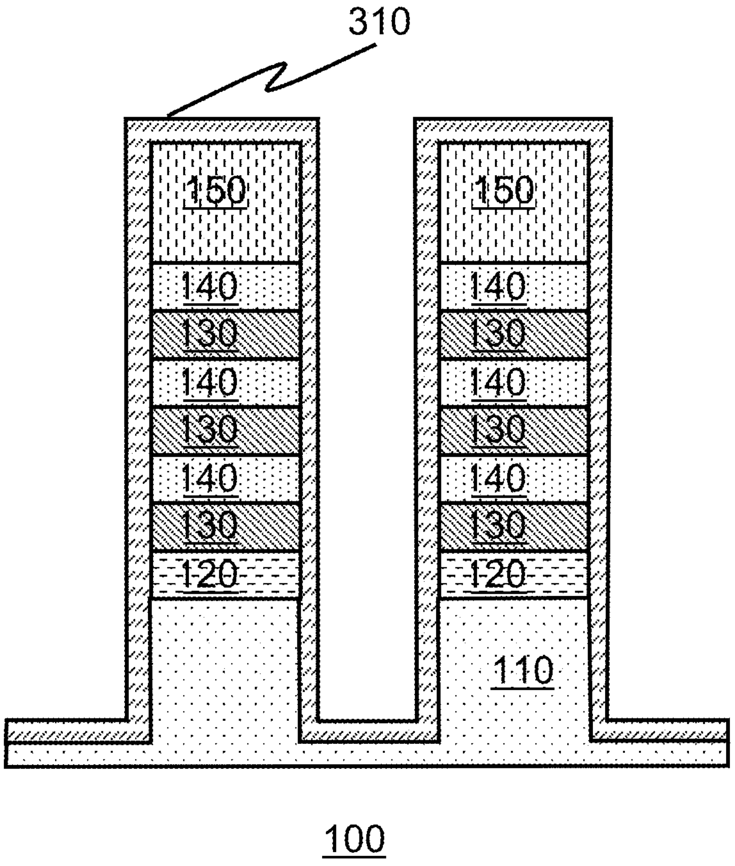
FIG. 2 provides a cross-sectional view of a step in the fabrication of a semiconductor device, according to an embodiment of the invention. The figure illustrates the device after the formation of device fins from the nanosheet stack.

FIG. 2 illustrates device 100 following the masking, patterning and etching of hard mask 150, nanosheet layers 120, 130, 140, and substrate 110 to form individual nanosheet channel fins for transistor formation. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching. After nanosheet patterning, a supporting shallow trench isolation liner 310, such as SiOC, is conformally deposited.

Figure 3:
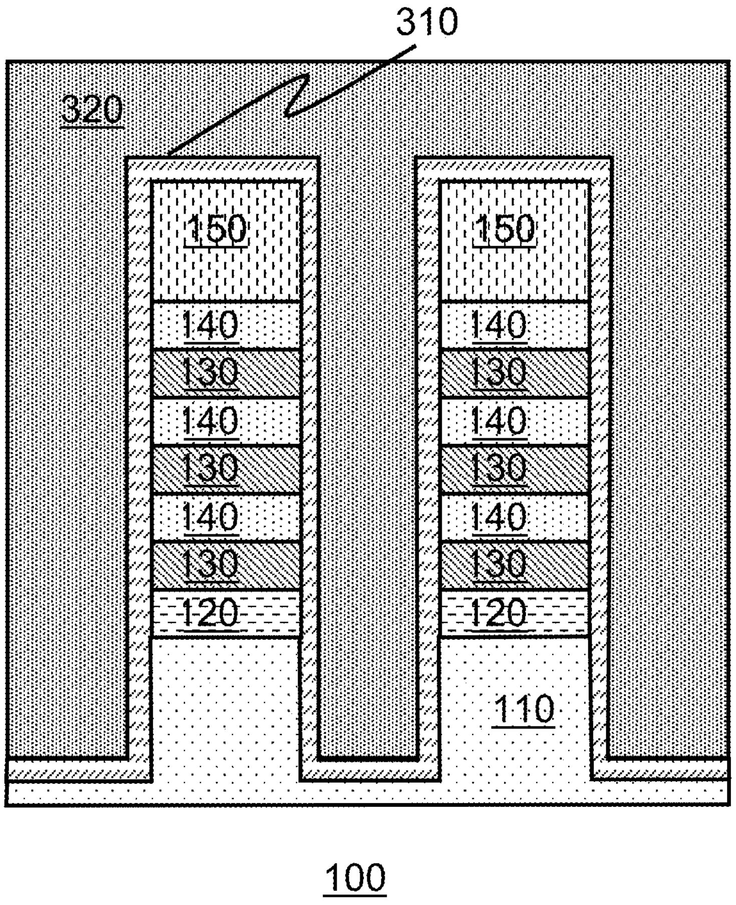
FIG. 3 provides a cross-sectional view of a step in the fabrication of a semiconductor device, according to an embodiment of the invention. The figure illustrates the device after the formation of a first STI liner.

FIG. 3 illustrates device 100 following deposition of a supportive fill material 320, such as amorphous carbon, between and around the individual nanosheet channel structures.

Figure 4:
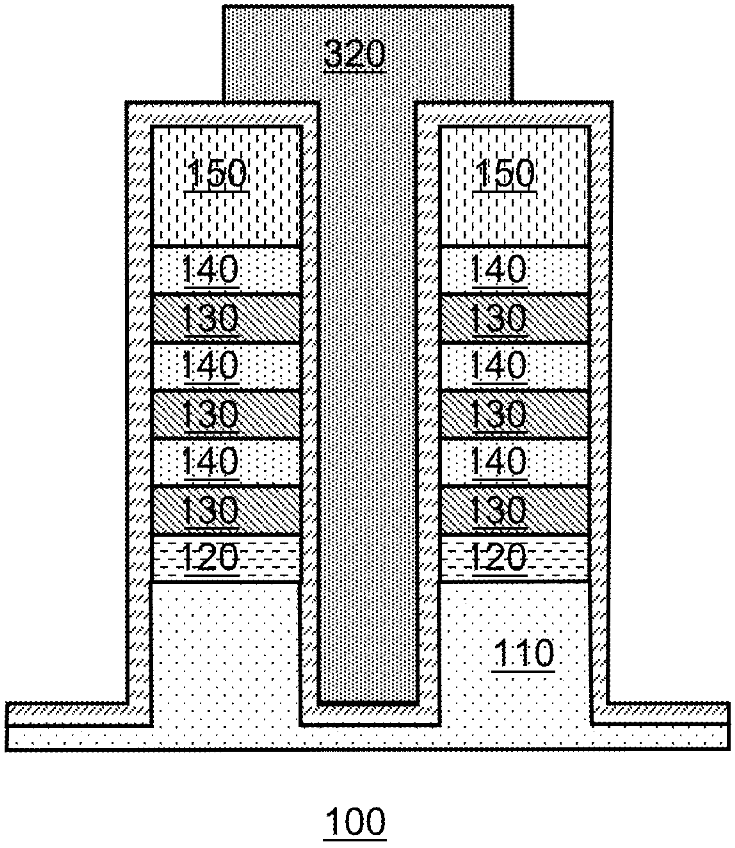
FIG. 4 provides a cross-sectional view, of a step in the fabrication of a semiconductor device, according to an embodiment of the invention. The figure illustrates the device after exposing portions of the first STI liner.

FIG. 4 illustrates device 100 following patterning and selective removal through etching of the amorphous carbon material 320, revealing outer portions of the nanosheet channels and the STI liner 310.

Figure 5:
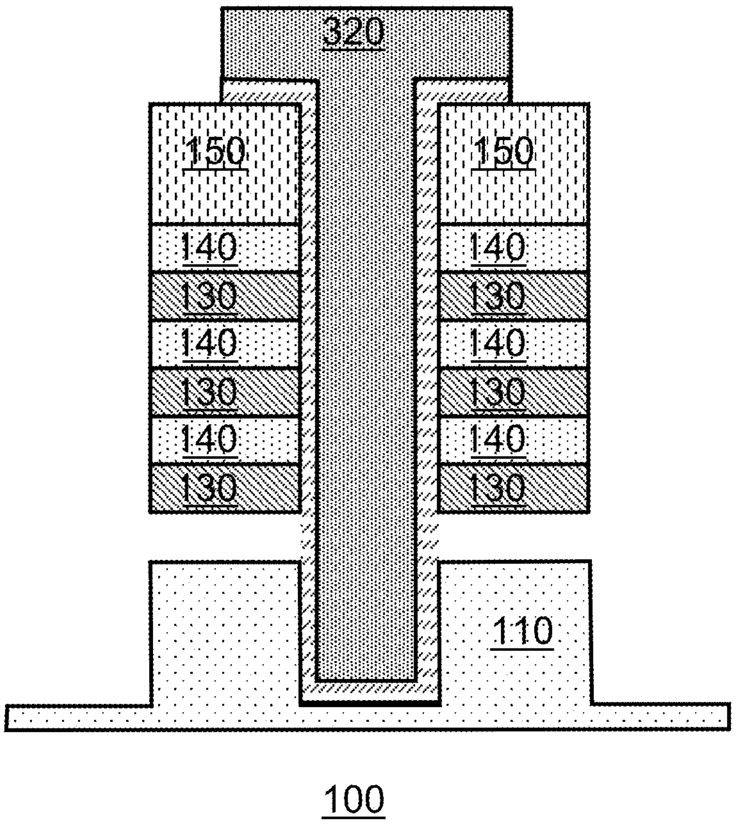
FIG. 5 provides a cross-sectional view of a step in the fabrication of a semiconductor device, according to an embodiment of the invention. The figure illustrates the device after the removal of the sacrificial layer from between the substrate and the nanosheet stacks.

FIG. 5 illustrates device 100 following selective etching of the unmasked portions of STI liner 310, and the subsequent removal of the high Ge sacrificial layer 120. This removal creates a void space for formation of the BDI. STI liner 310 and amorphous carbon 320 provide support for the remaining nanosheet stack layers following removal of the high Ge nanosheet layer from beneath the stack.

Figure 6:
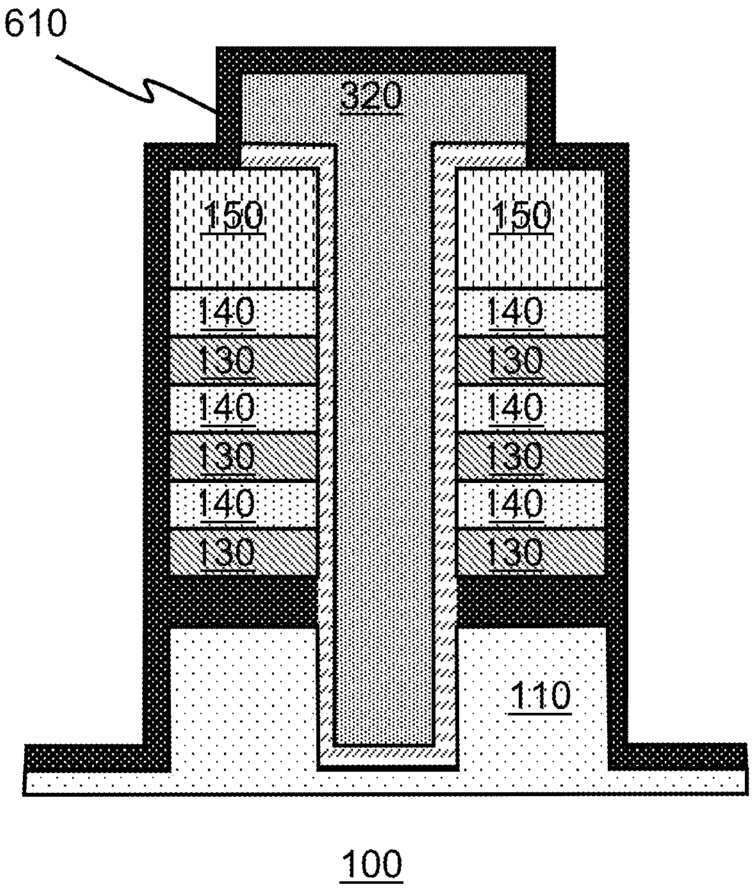
FIG. 6 provides a cross-sectional view of a step in the fabrication of a semiconductor device, according to an embodiment of the invention. The figure illustrates the device after the deposition of a second STI liner material.

FIG. 6 illustrates device 100 following conformal deposition of STI liner and BDI material 610, such as SiN, to fill the BDI void space and cover the device surfaces, including the substrate surfaces of the eventual STI regions. The conformal deposition of the STI liner and BDI material pinches off the void beneath the NS stack.

Figure 7:
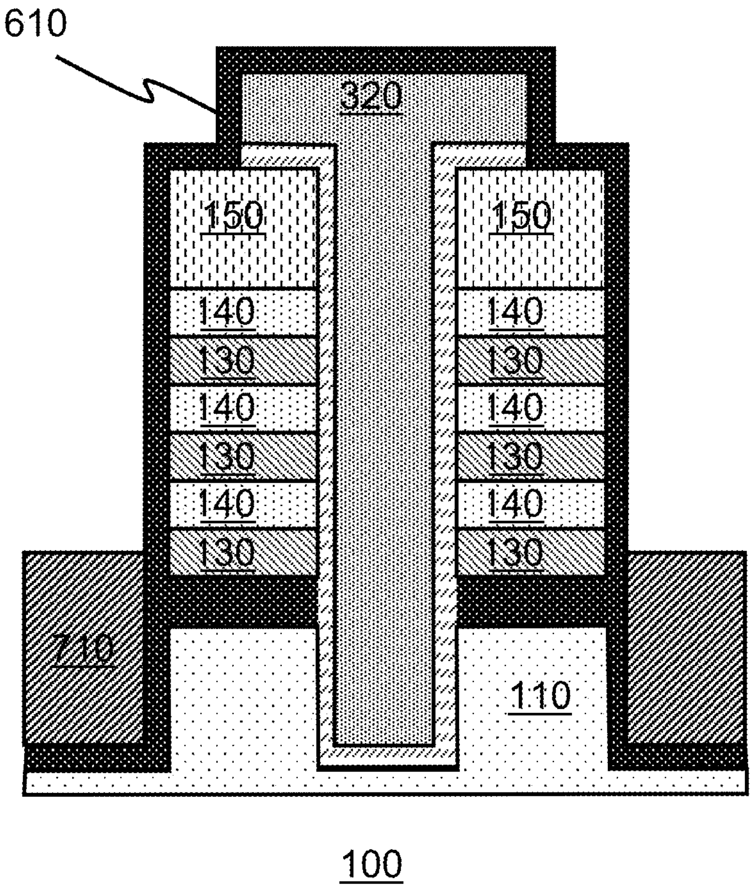
FIG. 7 provides a cross-sectional view of a step in the fabrication of a semiconductor device, according to an embodiment of the invention. The figure illustrates the device after the deposition of OPL materials.

FIG. 7 illustrates device 100 following deposition of a protective organic planarization layer (OPL) 710, in the eventual STI spaces to shield the STI liner 310 during subsequent fabrication steps. This can be achieved by spin-on coating OPL followed by OPL recess.

Figure 8:
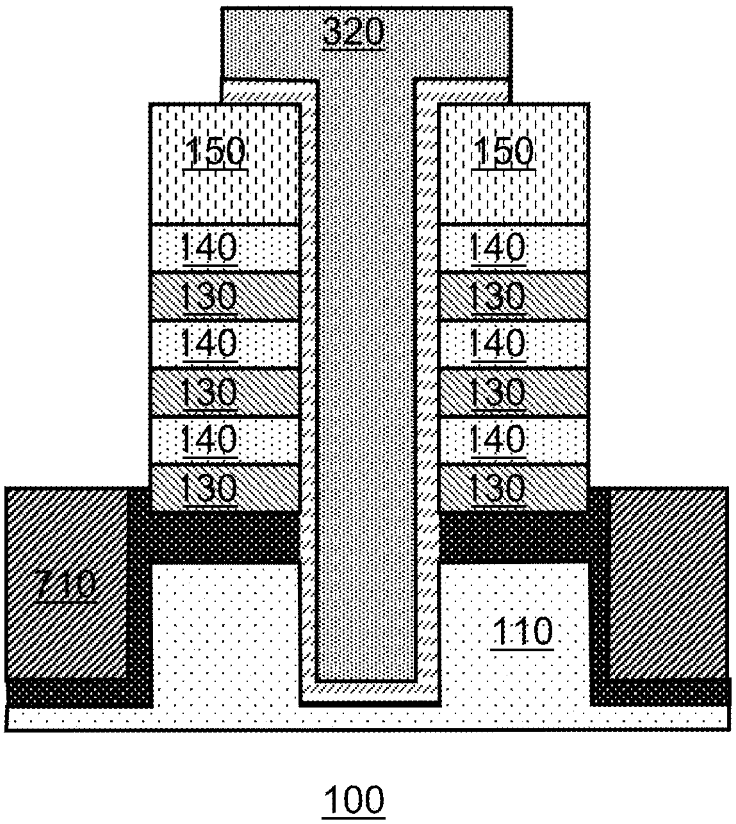
FIG. 8 provides a cross-sectional view of a step in the fabrication of a semiconductor device, according to an embodiment of the invention. The figure illustrates the device after the removal of excess STI liner material.

FIG. 8 illustrates device 100 following selective removal of unprotected portions of STI liner 610 through selective etching such as isotropic etching of the exposed SiN material from device surfaces.

Figure 9:
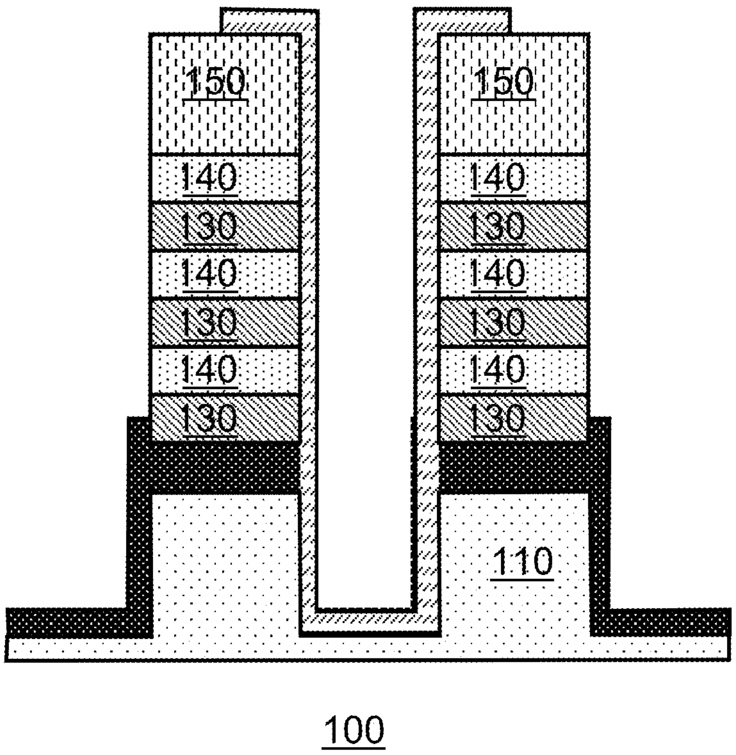
FIG. 9 provides a cross-sectional view of a step in the fabrication of a semiconductor device, according to an embodiment of the invention. The figure illustrates the device after the removal of the OPL and amorphous carbon masking materials.

FIG. 9 illustrates device 100 following selective removal of the amorphous carbon and OPL materials through an ashing process. This removal exposes the first STI liner material 310, and the second STI liner material 610, of the device.

Figure 10:
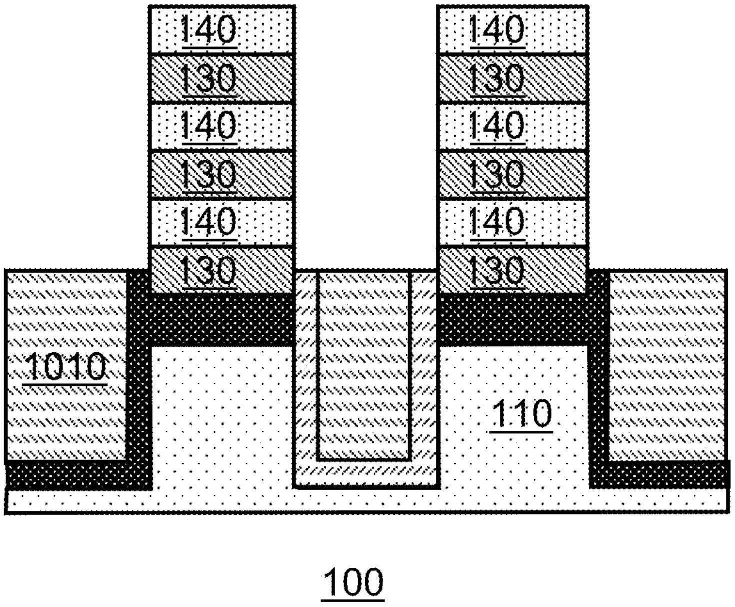
FIG. 10 provides a cross-sectional view of a step in the fabrication of a semiconductor device, according to an embodiment of the invention. The figure illustrates the device after the removal of the protective hard mask and the deposition of the STI material.

FIG. 10 illustrates device 100 following the deposition and subsequent chemical mechanical planarization (CMP) of STI material 1010, such as silicon dioxide, or any suitable combination of multiple dielectric materials (e.g., silicon nitride and silicon oxide). After that, a STI recess is performed to reveal the top alternating Si and SiGe layers 140 and 130. The figure further illustrates the removal of exposed portions of the first STI liner material 310, as well as the removal of hard mask 150 from the nanosheet stacks.

Figure 11:
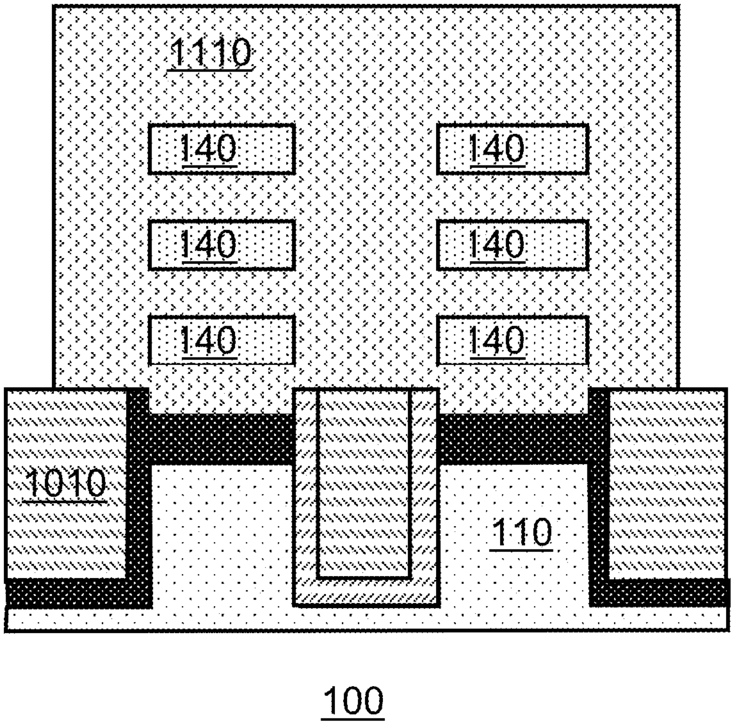
FIG. 11 provides a cross-sectional view of a step in the fabrication of a semiconductor device, according to an embodiment of the invention. The figure illustrates the device after the formation of dummy gates.

FIG. 11 illustrates the final device structure 100 along the gate, after the removal of sacrificial SiGe layers 130 from between nanosheet channel layers 140, and the formation of a replacement gate structure 1110 through the deposition of gate dielectric layer, such as high-k dielectric like HfO2, ZrO2, etc., and the deposition of work function metals, such as TiN, TiC, TiAlC, etc, and optional deposition of conductive metal fills like W, and CMP of the replacement HKMG. The transistor fabrication steps (not shown here) also include the formation of dummy gates, inner spacers between nanosheet channels, the epitaxial growth of doped source/drain regions, formation of interlayer dielectrics, gate open CMP, and MOL/BEOL contacts formation after the replacement gate 1110 is formed. Fabrication of upper device elements as well as forming external contacts and outer device packaging also follow execution of the disclosed methods. As shown in the Figure, first and second STI liner elements have different cross sections and may comprise symmetric or asymmetric elements with respect to the nanosheet channel elements of the device. The first and second STI liner elements may comprise similar or differing dielectric materials as well.

Figure 12:
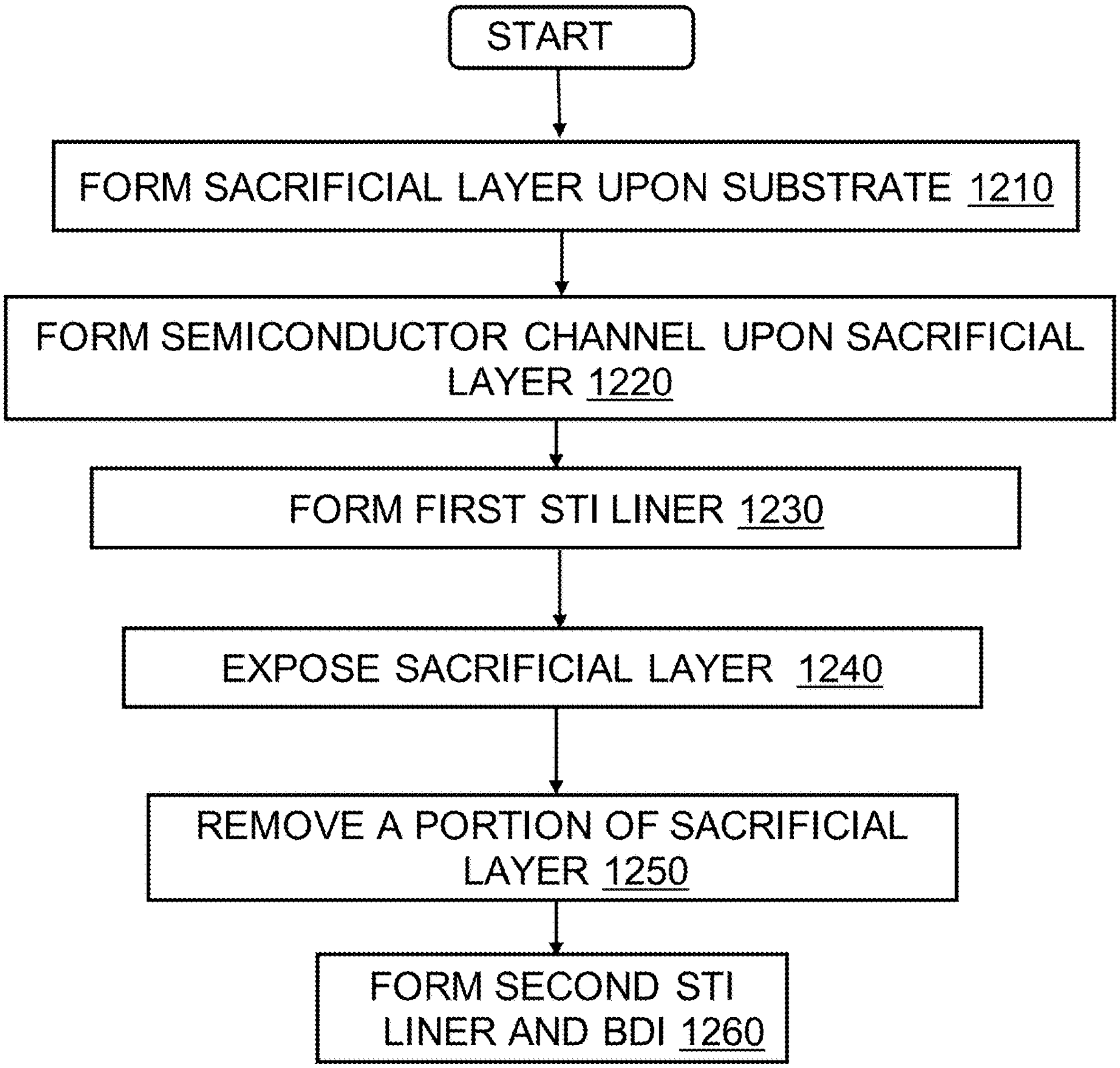
FIG. 12 provides a flowchart depicting operational steps for forming semiconductor device, according to an embodiment of the invention.

FIG. 12 provides flowchart 1200 depicting operational fabrication steps undertaken as part of disclosed methods. As shown in the Figure, at block 1210, the method forms a sacrificial semiconductor layer upon an underlying substrate. The sacrificial layer comprises a SiGe, or similar material. At block 1220, the method forms a semiconductor channel upon the sacrificial layer. The semiconductor channel may comprise a single semiconductor fin or a set of stacked semiconductor nanosheets disposed with alternating sacrificial semiconductor layers.

At block 1230, the method disposes a first STI liner material upon the semiconductor channel and the sacrificial layer. At block 1240 the method removes a portion of the first STI line, exposing a portion of the sacrificial layer.

At block 1250, the method removes at least a portion of the sacrificial layer from beneath the semiconductor channel. In an embodiment, the method removes all the sacrificial layer. At block 1260 the method forms a BDI layer beneath the semiconductor channel and forms a second STI liner continuous with the BDI layer. Additional fabrication steps associated with the formation of a dummy gate, inner spacers between semiconductor nanosheets, the epitaxial growth of device source/drain regions, and the fabrication of HKMG structures and upper device contacts follow the formation of the STI liner and BDI combination beneath the semiconductor channels.

Figure 13:
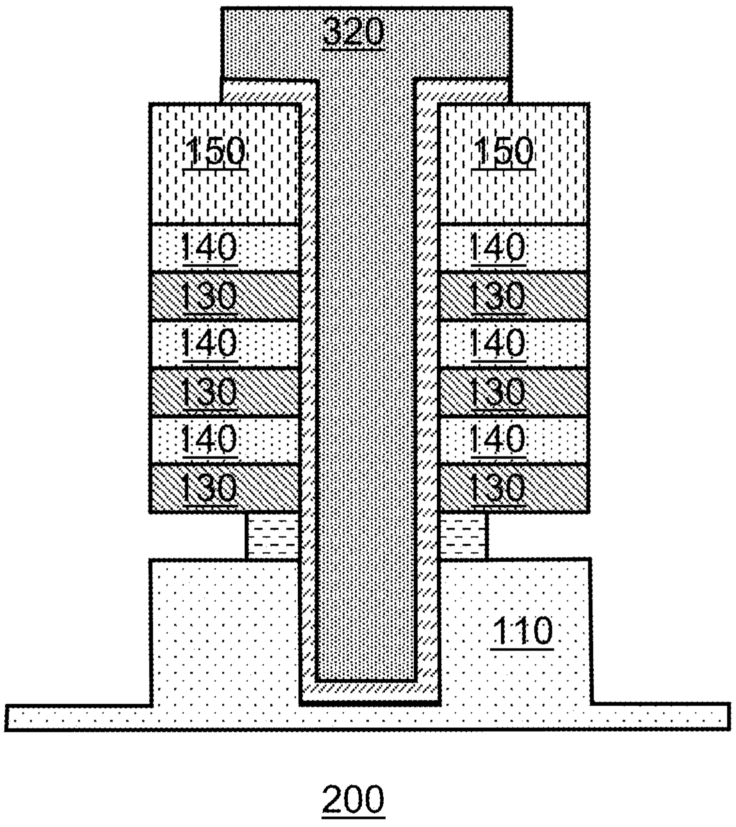
FIG. 13 provides a cross-sectional view of a step in the fabrication of a semiconductor device, according to an embodiment of the invention. The figure illustrates the device after the formation of channel fins from a nanosheet stack formed upon a substrate, the deposition of a first STI liner and a protective layer of amorphous carbon, and removal of a portion of the sacrificial layer from between the substrate and the nanosheet stacks.

FIG. 13 illustrates an alternative device fabrication sequence. As shown in the Figure, only part of sacrificial layer 120 has been removed from beneath the stack of nanosheets.

Figure 14:
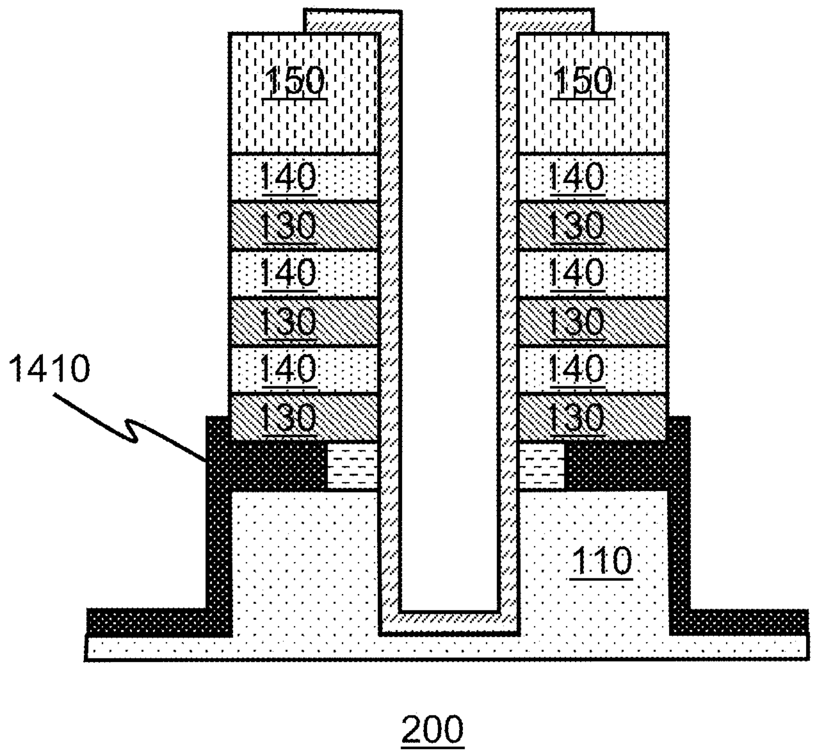
FIG. 14 provides a cross-sectional view of a step in the fabrication of a semiconductor device, according to an embodiment of the invention. The figure illustrates the device after the deposition of a second STI liner and BDI layer and removal of protective amorphous carbon.

FIG. 14 illustrates device 200 following conformal deposition of a first STI and bottom dielectric material 1410, such as SiN, filling the partial void beneath the nanosheet stack and lining the eventual STI region areas.

Figure 15:
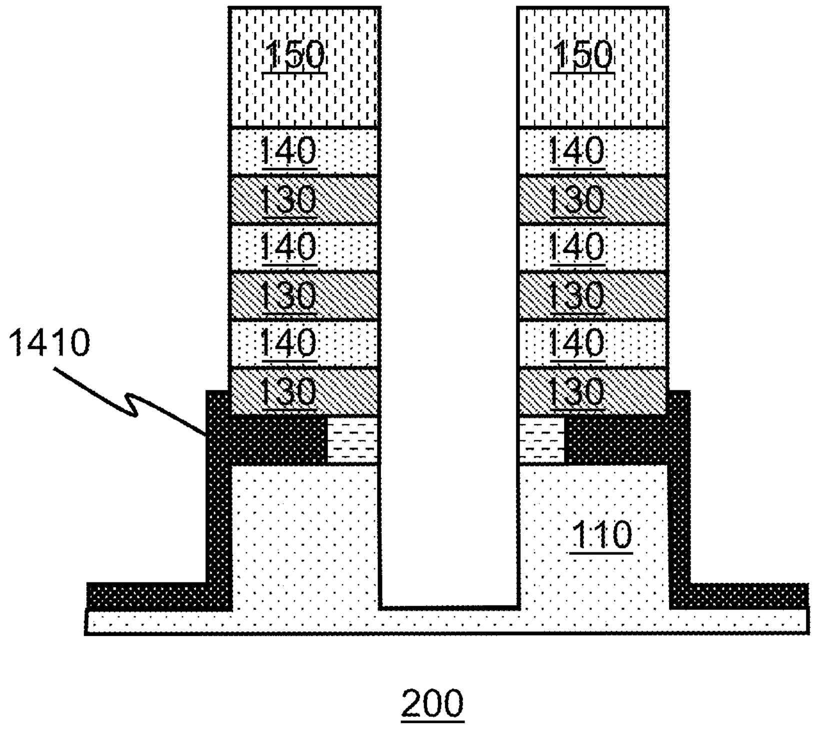
FIG. 15 provides a cross-sectional view of a step in the fabrication of a semiconductor device, according to an embodiment of the invention. The figure illustrates the device after the removal of the first STI liner.
Figure 16:
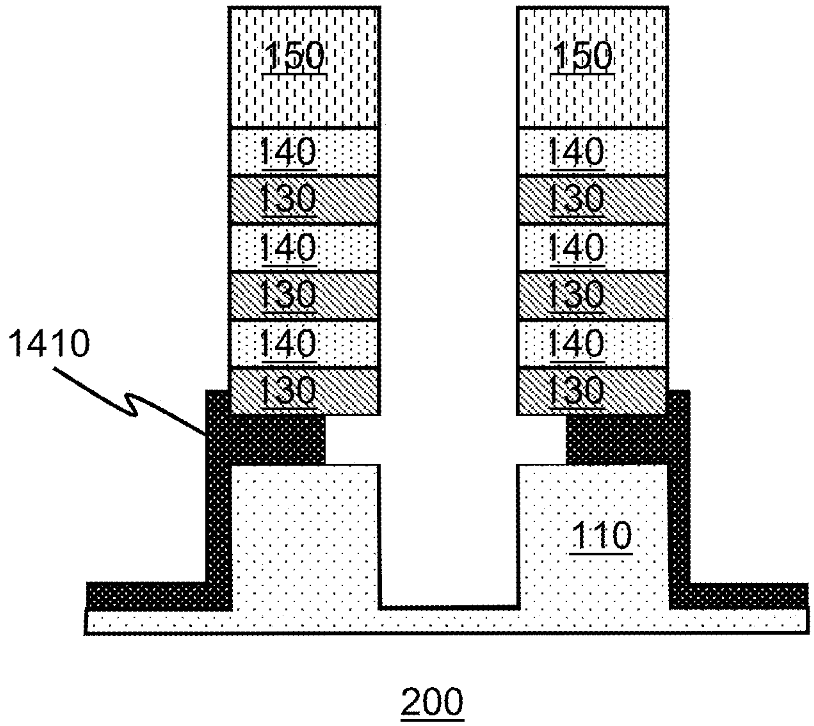
FIG. 16 provides a cross-sectional view of a step in the fabrication of a semiconductor device, according to an embodiment of the invention. The figure illustrates the device after the removal of the remainder of the sacrificial layer from between the substrate and the nanosheet stacks.

FIG. 15 illustrates device 200 following the removal of STI liner 310 from the opposing surfaces of the nanosheet channel structures by selective etching. FIG. 16 illustrates device 200 following selective removal of the remaining portion of sacrificial layer 120 from beneath the nanosheet stack.

Figure 17:
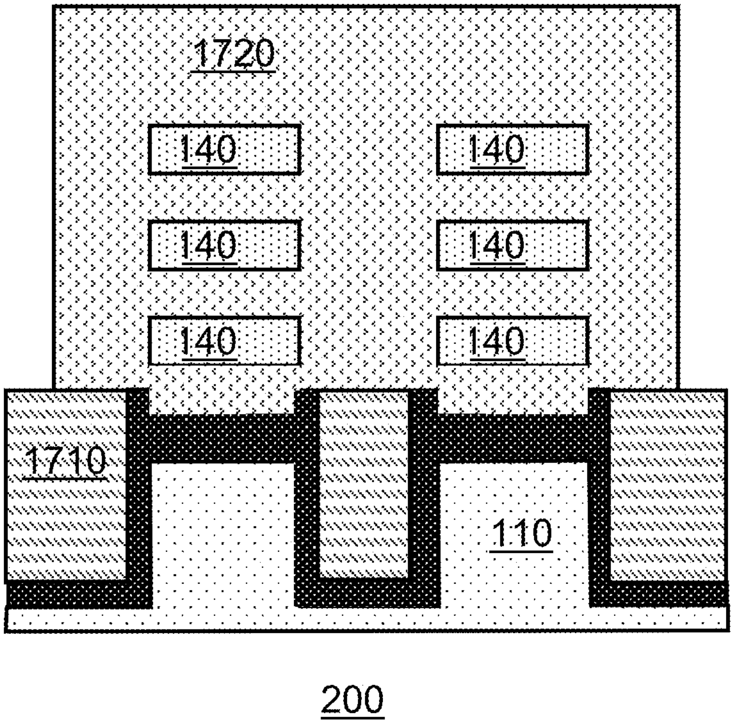
FIG. 17 provides a cross-sectional view of a step in the fabrication of a semiconductor device, according to an embodiment of the invention. The figure illustrates the device after the deposition of additional STI liner material as well as the deposition of the STI material and the formation of the dummy gate.

FIG. 17 illustrates device 200 following deposition of additional bottom dielectric and STI liner material, filling the remaining void space beneath the nanosheet stack and lining the eventual STI region between the nanosheet structures. The figure further illustrates the device following deposition of STI material 1710, release of sacrificial layers 130 from between nanosheets 140, and formation of replacement HKMG 1720, around the nanosheets 140.

Figure 18:
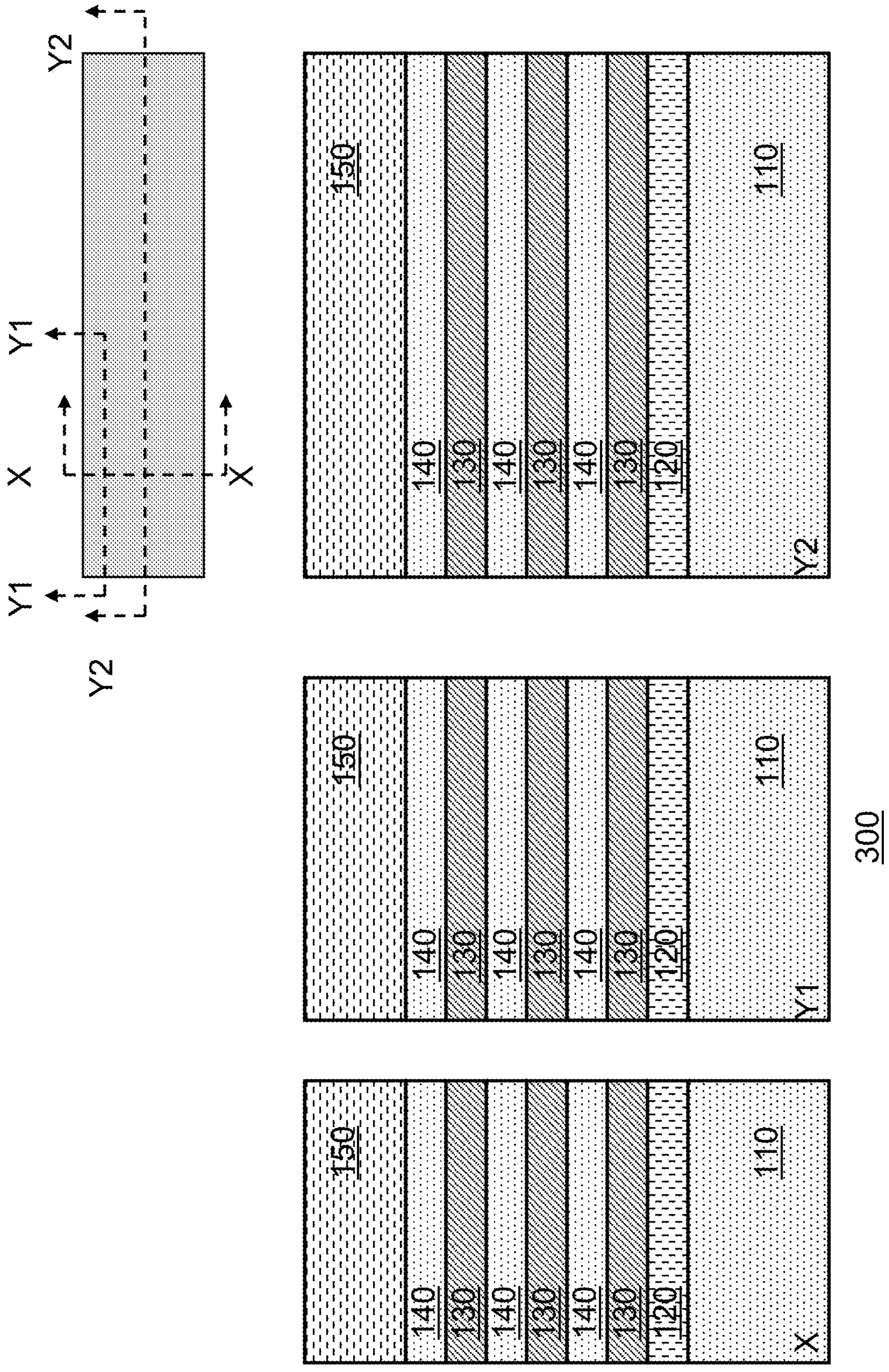
FIG. 18 provides cross-sectional views of a step in the fabrication of a semiconductor device, according to an embodiment of the invention. The figure illustrates a formed stack of alternating nanosheet upon a substrate and sacrificial semiconductor layer.

FIGS. 18-28 illustrate an alternative fabrication sequence. These Figures include cross-sectional view X, Y1, and Y2, as indicated in the plan view of the Figures. FIG. 18 illustrates a stack of nanosheets 130, 140 grown upon a sacrificial layer 120, which is in turn disposed upon substrate 110. Substrate 110, and nanosheets 120, 130, 140, and hard mask 150 are similar or identical to those elements described above with reference to FIGS. 1-11.

Figure 19:
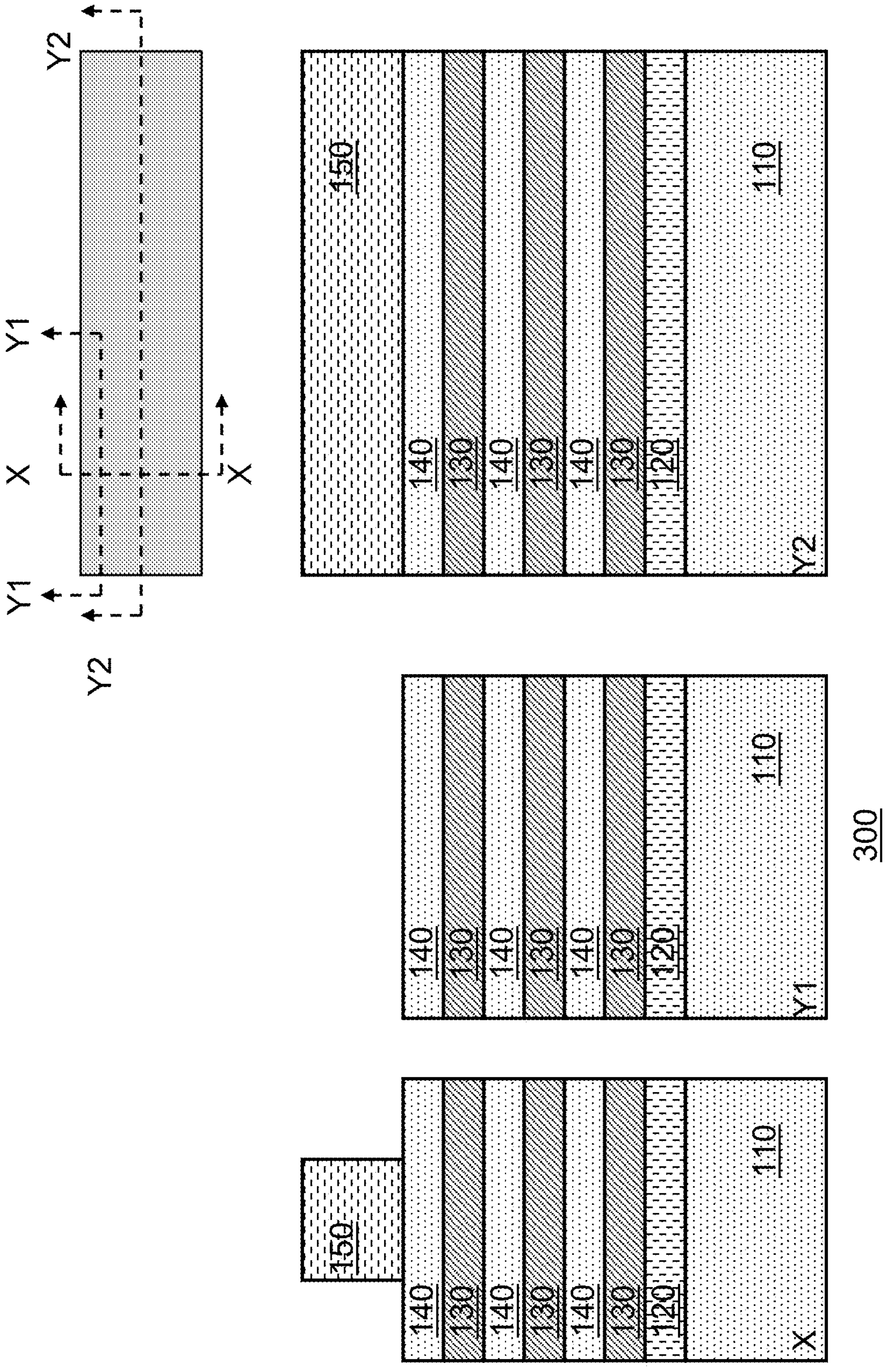
FIG. 19 provides cross-sectional views of a step in the fabrication of a semiconductor device, according to an embodiment of the invention. The figure illustrates the device after the initial patterning of device fins from the nanosheet stack.
Figure 20:
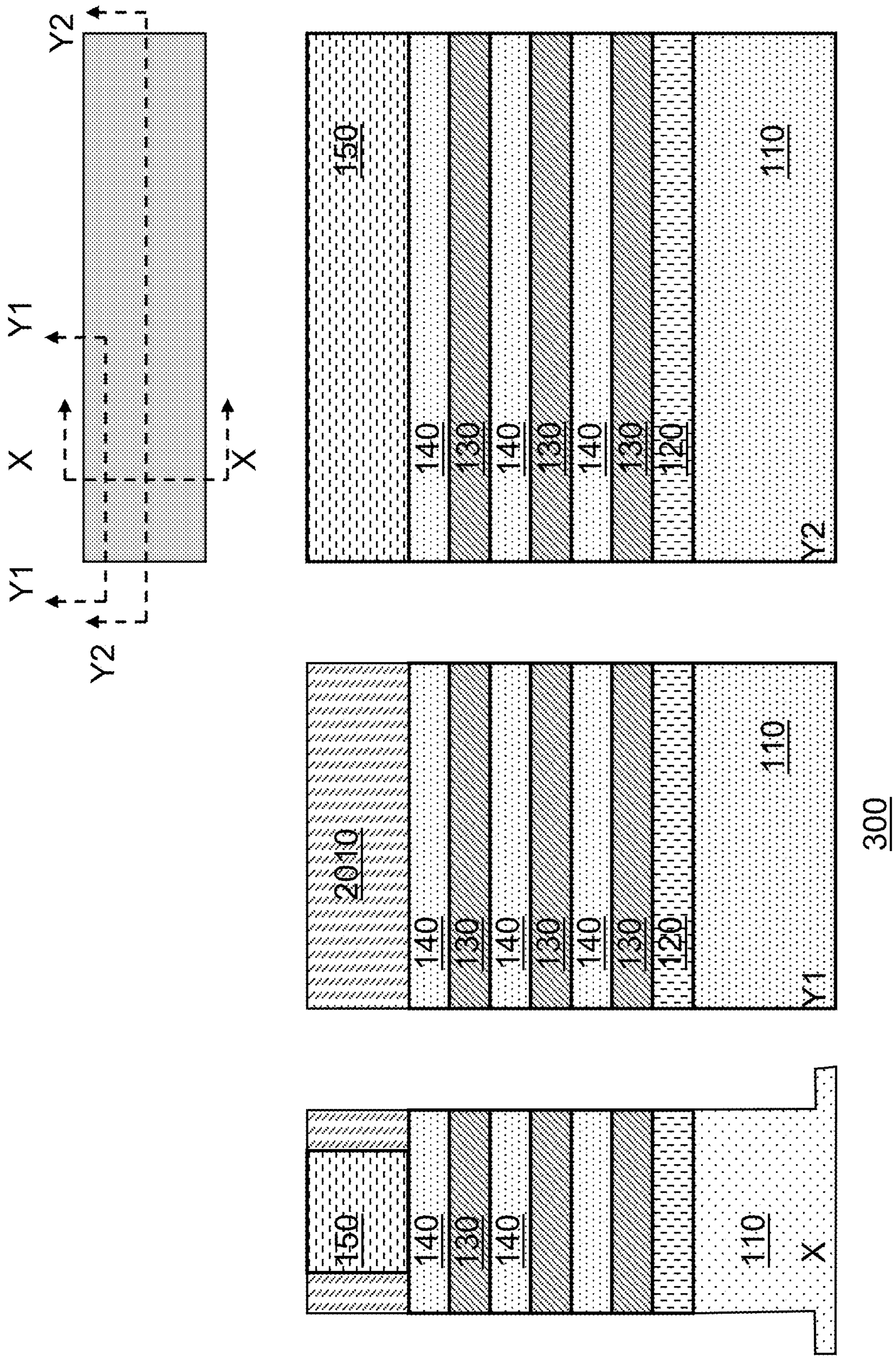
FIG. 20 provides cross-sectional views of a step in the fabrication of a semiconductor device, according to an embodiment of the invention. The figure illustrates the device after the formation of sacrificial spacers above the nanosheet stack.

FIG. 19 illustrates device 300 following patterning and selective removal of portions of hard mask 150 in preparation of further fabrication steps. FIG. 20 illustrates device 300 following fabrication of sacrificial spacers, such as comprising materials like AlOx, TiN, or TiOx, adjacent to hard mask 150. The figure further illustrates a first etching of the nanosheet stack, reducing the width of the stack in the X direction of the views.

Figure 21:
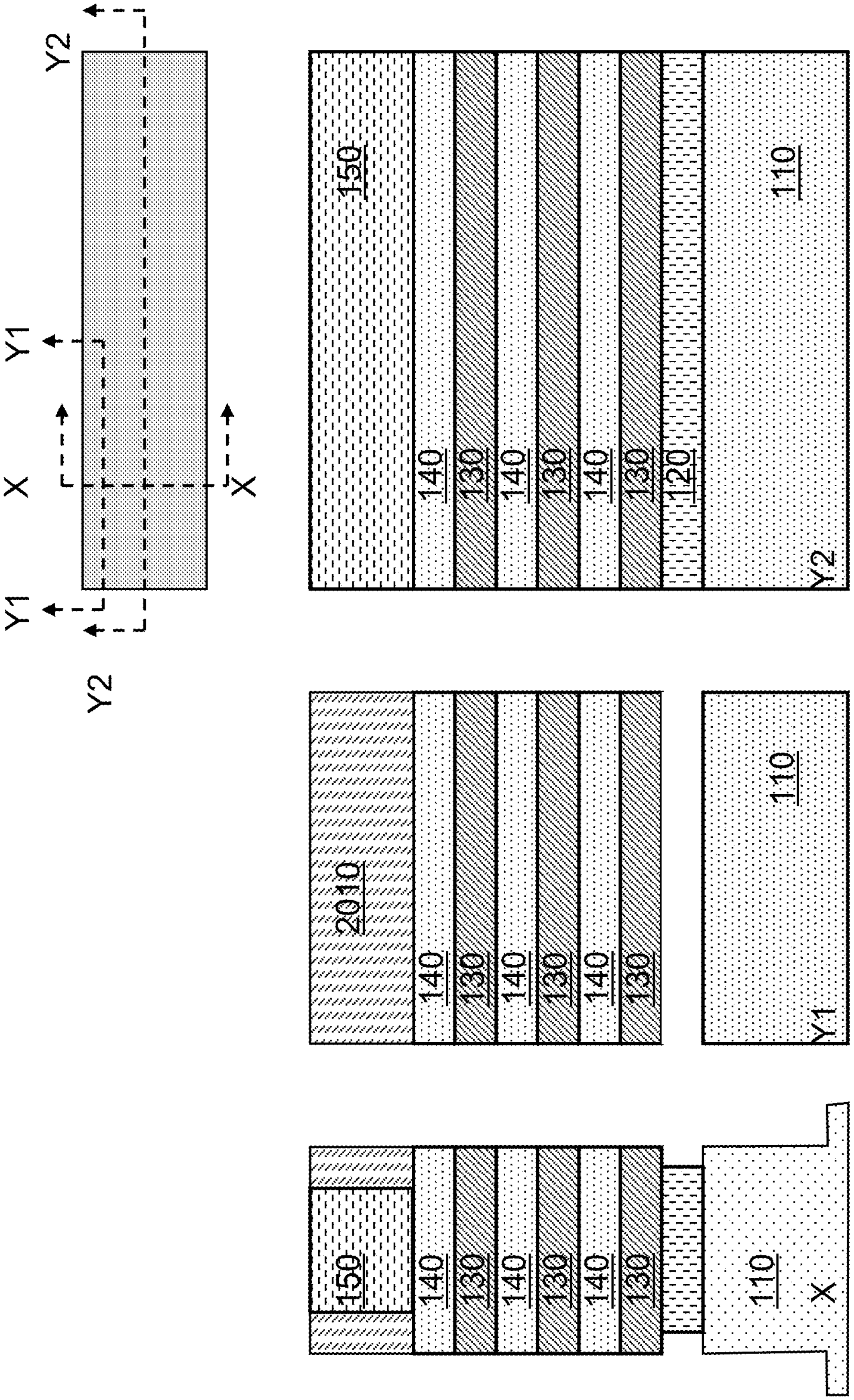
FIG. 21 provides a cross-sectional view, of a step in the fabrication of a semiconductor device, according to an embodiment of the invention. The figure illustrates the device after removal of edge portions of the sacrificial layer.

FIG. 21 illustrates device 300 following selective removal of edge portions of the sacrificial layer 120 beneath the nanosheet stack through selective etching of the SiGe material of the layer.

Figure 22:
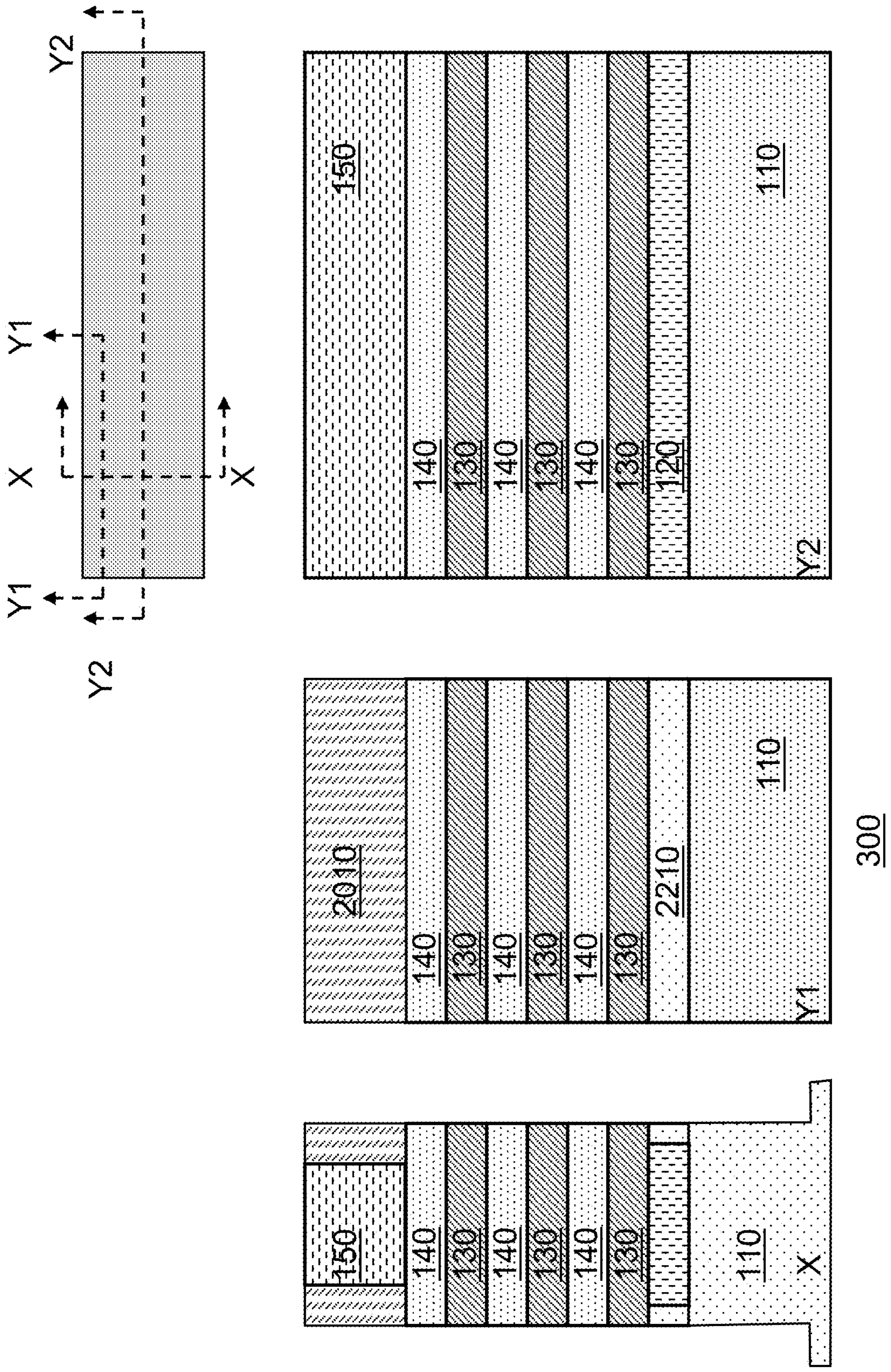
FIG. 22 provides cross-sectional views of a step in the fabrication of a semiconductor device, according to an embodiment of the invention. The figure illustrates the device after the formation of inner spacers between the substrate and nanosheet stack.

FIG. 22 illustrates device 300 following deposition of a first BDI material 2210, such as SiC, SiOC, or similar materials, filling the void spaces formed by removal of edge portions of the sacrificial layer from beneath the nanosheet stack.

Figure 23:
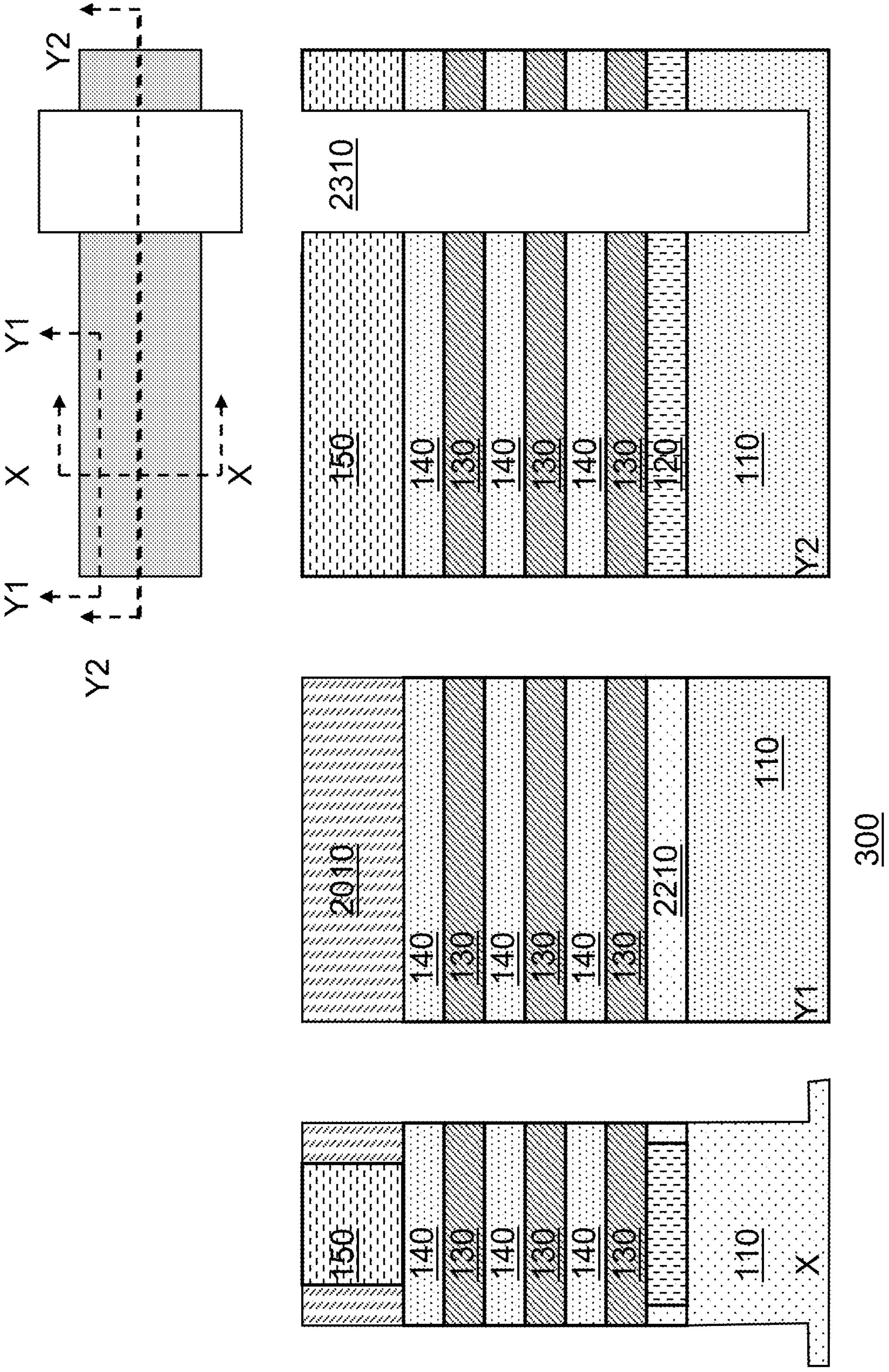
FIG. 23 provides cross-sectional views of a step in the fabrication of a semiconductor device, according to an embodiment of the invention. The figure illustrates the device after the formation of a fin cut for the device.

FIG. 23 illustrates device 300 following formation of a trench through a fin cut 2310, for the device design using etching such as RIE.

Figure 24:
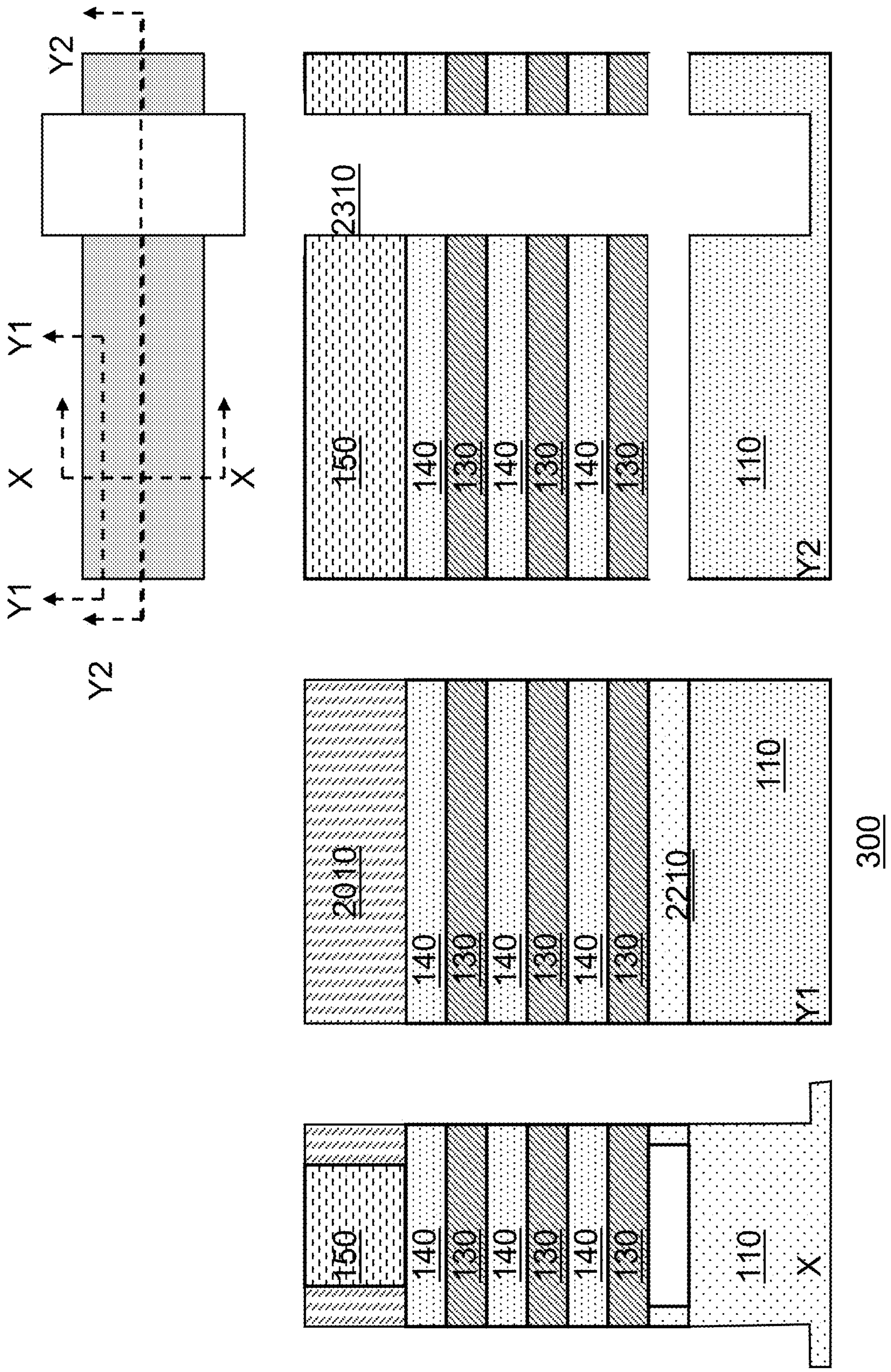
FIG. 24 provides cross-sectional views of a step in the fabrication of a semiconductor device, according to an embodiment of the invention. The figure illustrates the device after the removal of the remainder of the sacrificial layer.

FIG. 24 illustrates device 300 following removal of the remaining sacrificial layer 120 material between dielectric side spacers 2210. These spacers 2210, support the nanosheet stack following removal of the remaining sacrificial layer 120 from beneath the nanosheet stack.

Figure 25:
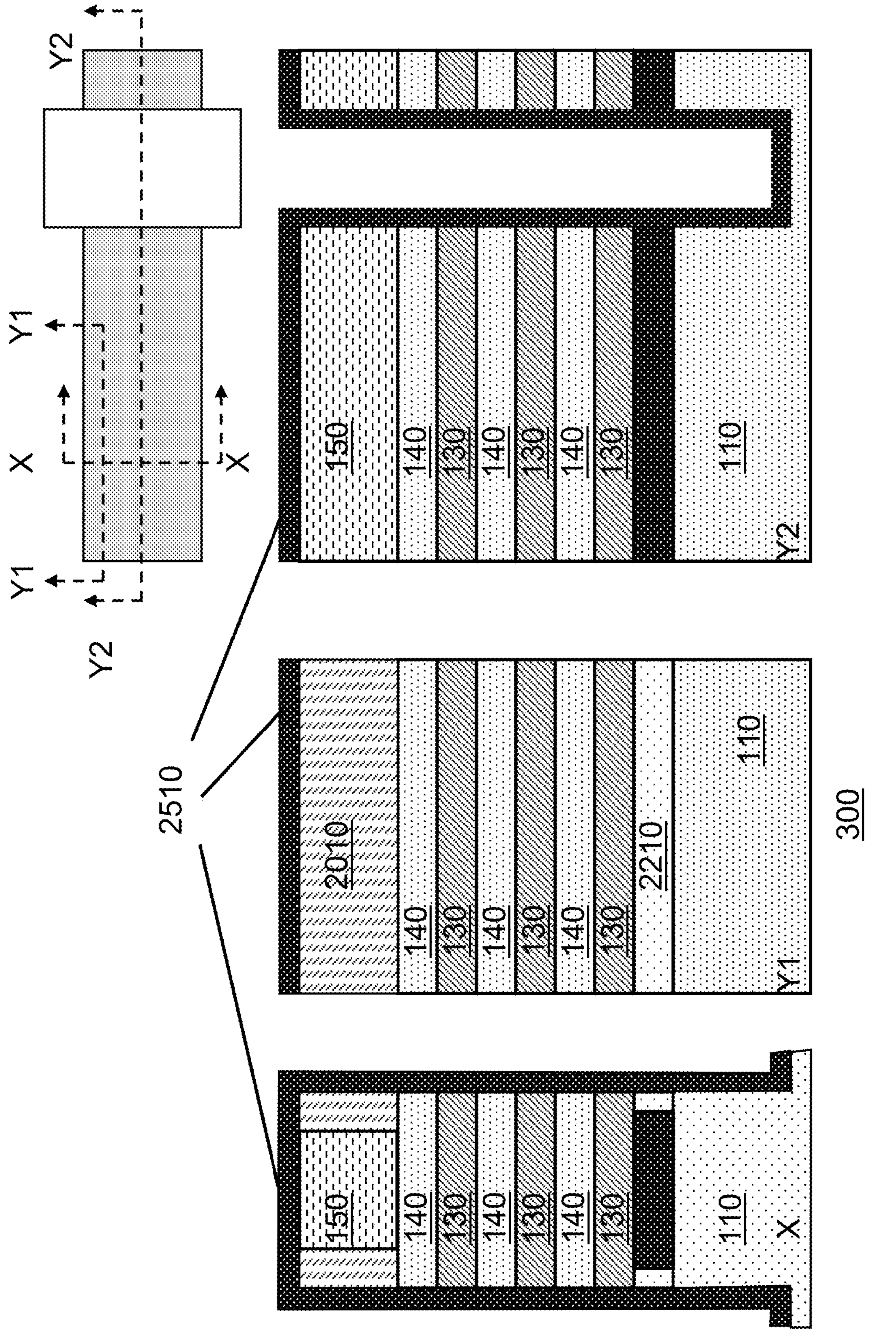
FIG. 25 provides cross-sectional views of a step in the fabrication of a semiconductor device, according to an embodiment of the invention. The figure illustrates the device after the deposition of STI liner material.

FIG. 25 illustrates device 300 following deposition of bottom dielectric and STI liner materials 2510, such as SiN, filling the void beneath the nanosheet stack and upon exposed device surfaces in the eventual STI regions.

Figure 26:
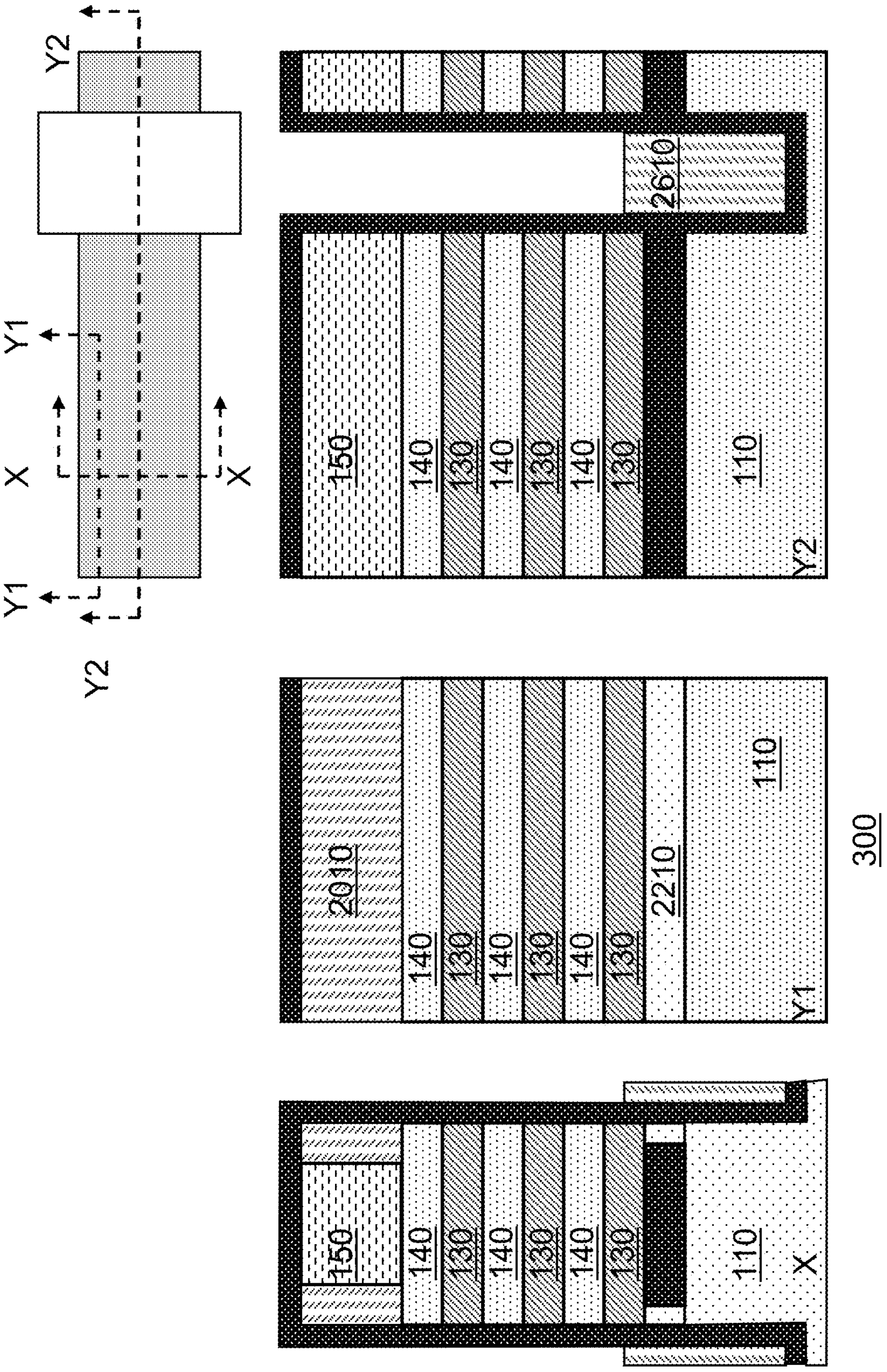
FIG. 26 provides cross-sectional views of a step in the fabrication of a semiconductor device, according to an embodiment of the invention. The figure illustrates the device after the deposition of STI materials.

FIG. 26 illustrates device 300 following deposition, CMP and recess of STI material 2610 such as silicon dioxide, or any suitable combination of multiple dielectric materials (e.g., silicon nitride and silicon oxide).

Figure 27:
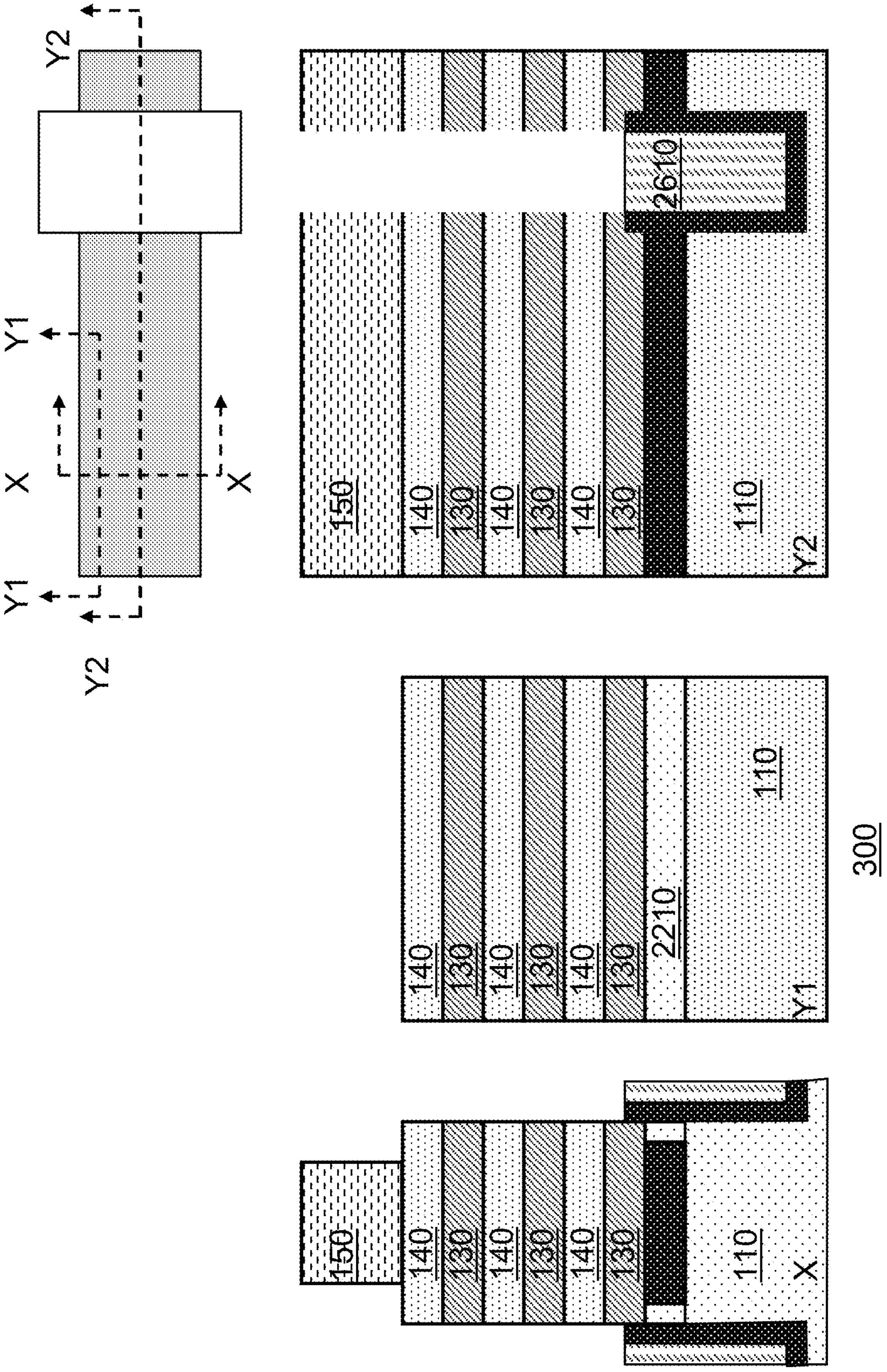
FIG. 27 provides a cross-sectional view of a step in the fabrication of a semiconductor device, according to an embodiment of the invention. The figure illustrates the device after the removal of the sacrificial spacers.

FIG. 27 illustrates device 300 following selective etching to remove the exposed STI liner and sacrificial spacers 2010 from the device.

Figure 28:
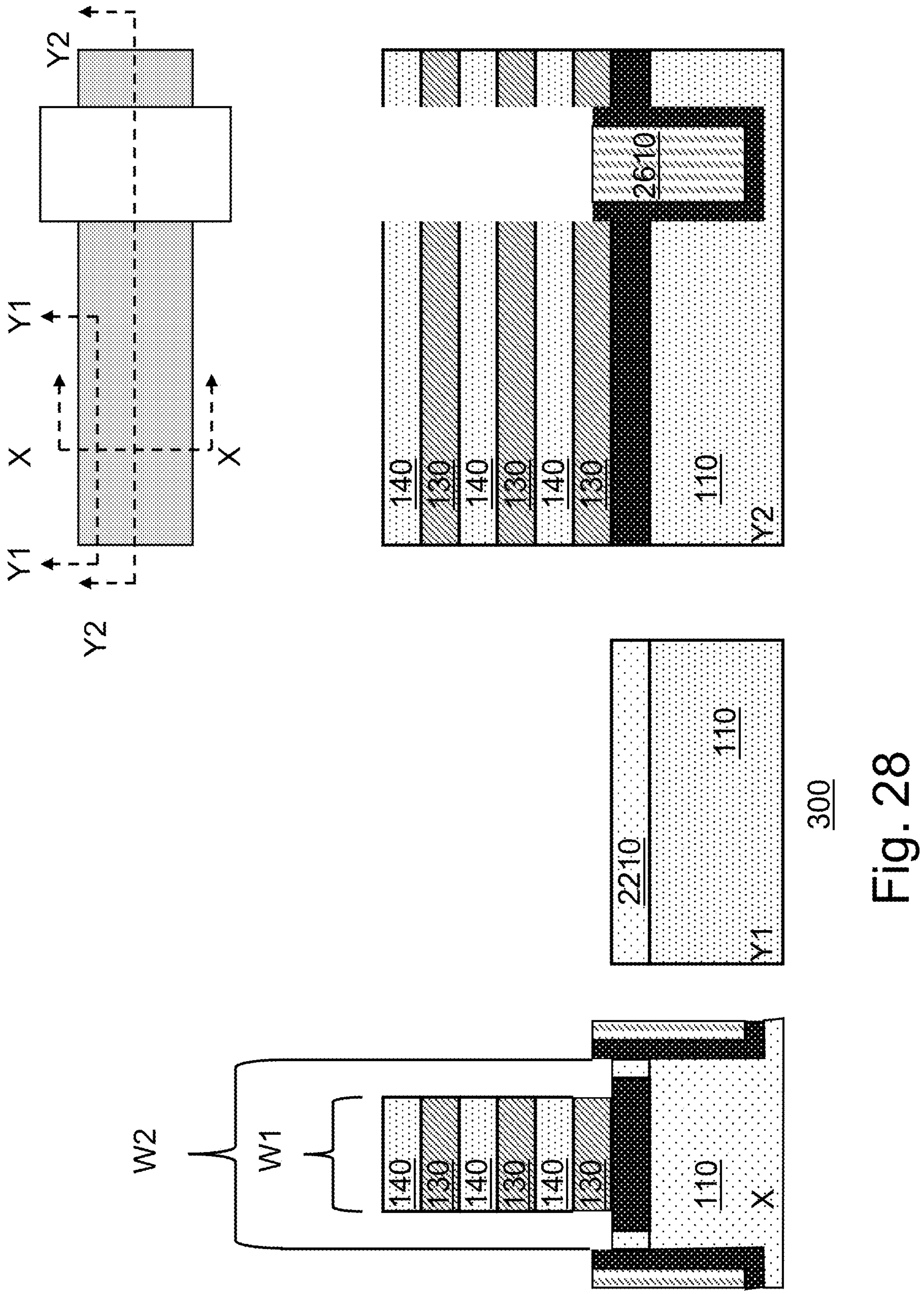
FIG. 28 provides a cross-sectional view of a step in the fabrication of a semiconductor device, according to an embodiment of the invention. The figure illustrates the device after the etching of the nanosheet channels and removal of the nanosheet stack protective hard mask.

FIG. 28 illustrates device 300 following RIE of the nanosheet stack to further reduce the X width of the stack to the final desired width. As shown in the Figure, the channel stack and BDI regions form an inverted "T" shape wherein the nanosheet stack has a first width W1, in the X direct, the combined BDI dielectric material have a second width W2, in the X direction, and the second width W2, exceeds the first width W1.

Figure 29:
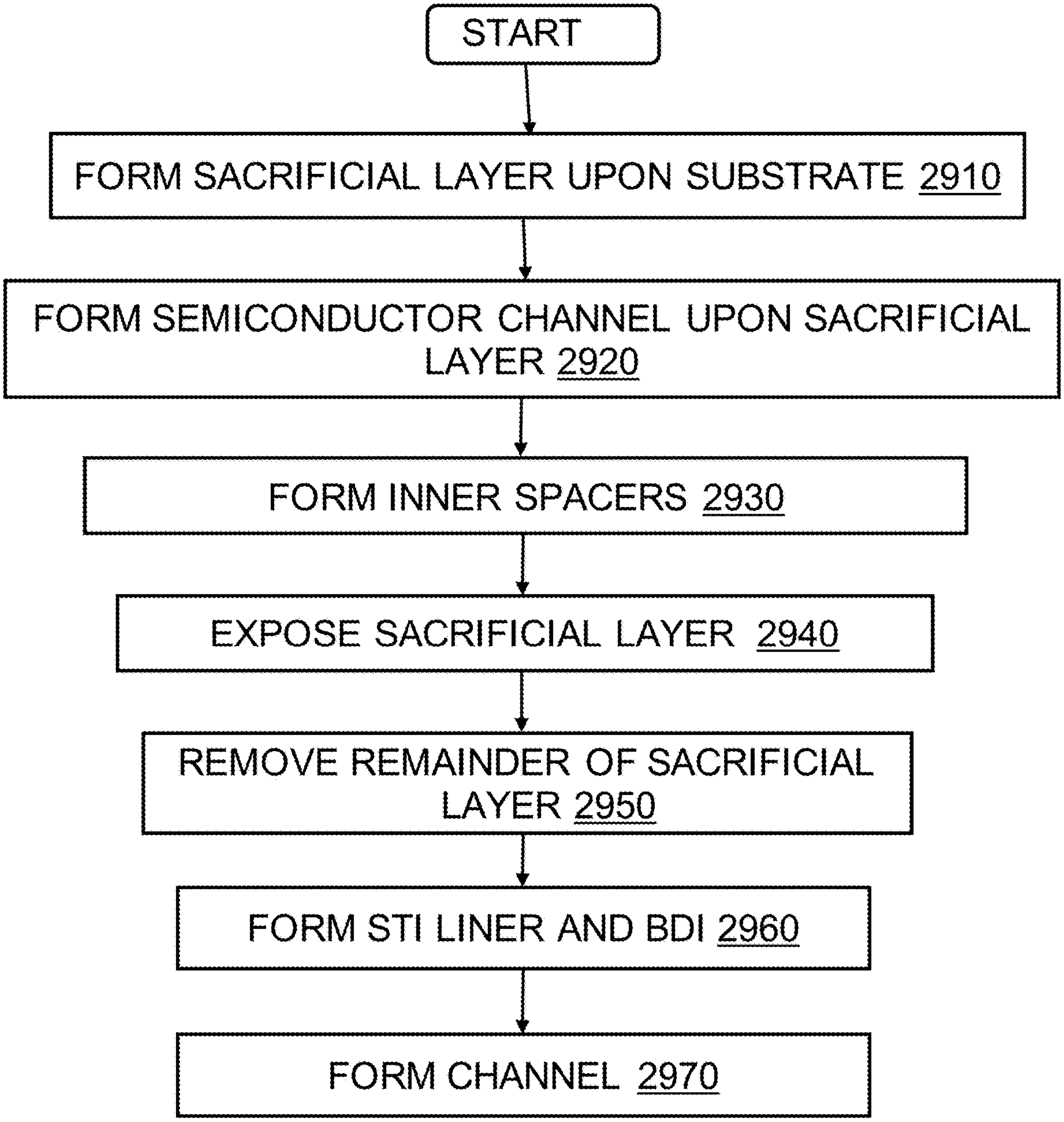
FIG. 29 provides a flowchart depicting operational steps for forming semiconductor device, according to an embodiment of the invention.

Flowchart 2900, of FIG. 29, lists operational steps associated with fabrication of semiconductor devices, according to an embodiment of the invention. As shown in the Figure, at block 2910, the method forms a sacrificial semiconductor layer upon an underlying substrate. The sacrificial layer comprises a SiGe, or similar material. At block 1220, the method forms a semiconductor channel upon the sacrificial layer. The semiconductor channel may comprise a single semiconductor fin or a set of stacked semiconductor nanosheets disposed with alternating sacrificial semiconductor layers. Formation of the channel includes patterning an upper hard mask layer to define an initial channel width and forming sacrificial spacers adjacent to the remaining hard mask portion.

At block 2930, edge portions of the sacrificial layer are selectively etched away and replaced with a first dielectric material as part of the BDI layer. These edge dielectric inner spacers support the channel during subsequent fabrication steps.

At block 2940, a fin cut through the channel to the substrate exposes a portion of the sacrificial layer beneath the channel and between the inner spacers. At block 2950, selective etching removes the remaining portion of the sacrificial layer from beneath the channel structure. At block 2960, deposition of a second dielectric in the void space beneath the channel and upon the exposed device surfaces completes the BDI layer and forms the STI liner continuously with the BDI layer.

At block 2970, formation of the channel continues with removal of the sacrificial spacers, narrowing the channel width, and removal of the hard mask from the upper surface of the channel. Additional fabrication steps necessary to form device dummy gate structures, channel inner spacers between otherwise adjacent nanosheets, grow device source/drain regions, and replace the dummy gates with HKMG structures as well as add upper device contacts continue the fabrication of the device.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a substrate;

a first shallow trench isolation (STI) liner disposed above and in contact with the substrate;

a bottom dielectric isolation (BDI) region disposed above the substate and in contact with the STI liner;

a device channel disposed directly above the BDI region, the BDI extending across a full length and a full width of the device channel; and a gate stack disposed above and in contact with the device channel, the STI, and the BDI.

2. The semiconductor device according to claim 1 further comprising a second STI liner disposed above the substrate and in contact with the BDI region.

3. The semiconductor device according to claim 2, wherein the first STI liner and the second STI liner are asymmetric with respect to the channel.

4. The semiconductor device according to claim 1 further comprising an STI region disposed above and in contact with the first STI liner.

5. The semiconductor device according to claim 1, wherein the channel comprises a stack of semiconductor nanosheets.

6. The semiconductor device according to claim 1, wherein the channel comprises a single semiconductor fin.

7. The semiconductor device according to claim 1, wherein the channel comprises a first width, the BDI region comprises a second width, wherein the second width exceeds the first width, and wherein the BDI comprises an inner dielectric and an outer dielectric.

* * * * *